(12) United States Patent
Montemayor et al.

(10) Patent No.: US 7,362,178 B2
(45) Date of Patent: Apr. 22, 2008

(54) WIDE DYNAMIC RANGE AMPLIFIER GAIN CONTROL

(75) Inventors: Raymond Montemayor, Encinitas, CA (US); Curtis Ling, Carlsbad, CA (US)

(73) Assignee: MaxLinear, Inc., Carlsbad, CA (US)

( * ) Notice: Subject to any disclaimer, the term of this patent is extended or adjusted under 35 U.S.C. 154(b) by 0 days.

(21) Appl. No.: 11/464,162

(22) Filed: Aug. 11, 2006

(65) Prior Publication Data
US 2007/0126508 A1 Jun. 7, 2007

Related U.S. Application Data

(60) Provisional application No. 60/707,867, filed on Aug. 12, 2005.

(51) Int. Cl.
*H03G 3/10* (2006.01)
(52) U.S. Cl. ...................................... 330/284; 330/278
(58) Field of Classification Search ................ 330/284, 330/278, 279
See application file for complete search history.

(56) References Cited

U.S. PATENT DOCUMENTS

| | | | |
|---|---|---|---|
| 5,204,637 A * | 4/1993 | Trinh | ......................... 330/129 |
| 5,603,114 A | 2/1997 | Tomita | |
| 6,052,566 A | 4/2000 | Abramsky | |
| 6,072,998 A | 6/2000 | Kaku | |
| 6,278,324 B1 * | 8/2001 | Hojabri et al. | .............. 330/284 |
| 6,677,823 B2 * | 1/2004 | Terosky et al. | .............. 330/289 |
| 6,754,479 B1 | 6/2004 | Hughes | |
| 2003/0207675 A1 | 11/2003 | Hughes | |

FOREIGN PATENT DOCUMENTS

| | | |
|---|---|---|
| EP | 0 814 568 A | 12/1997 |
| JP | 58 194414 A | 11/1983 |

* cited by examiner

*Primary Examiner*—Henry Choe
(74) *Attorney, Agent, or Firm*—Townsend and Townsend and Crew LLP

(57) ABSTRACT

Linear wide dynamic range variable gain amplifiers can be configured using a variable gain amplifier having an abbreviated gain control range in combination with a discrete attenuator controlled to select an attenuation from a predetermined set of attenuation values. The variable gain amplifier is configured to provide substantially linear gain control over the abbreviated gain control range, where the abbreviated gain control range is less than a total desired gain control range. The difference between adjacent attenuation values in the set of attenuation values is configured to be approximately less than or equal to the abbreviated gain control range.

23 Claims, 6 Drawing Sheets

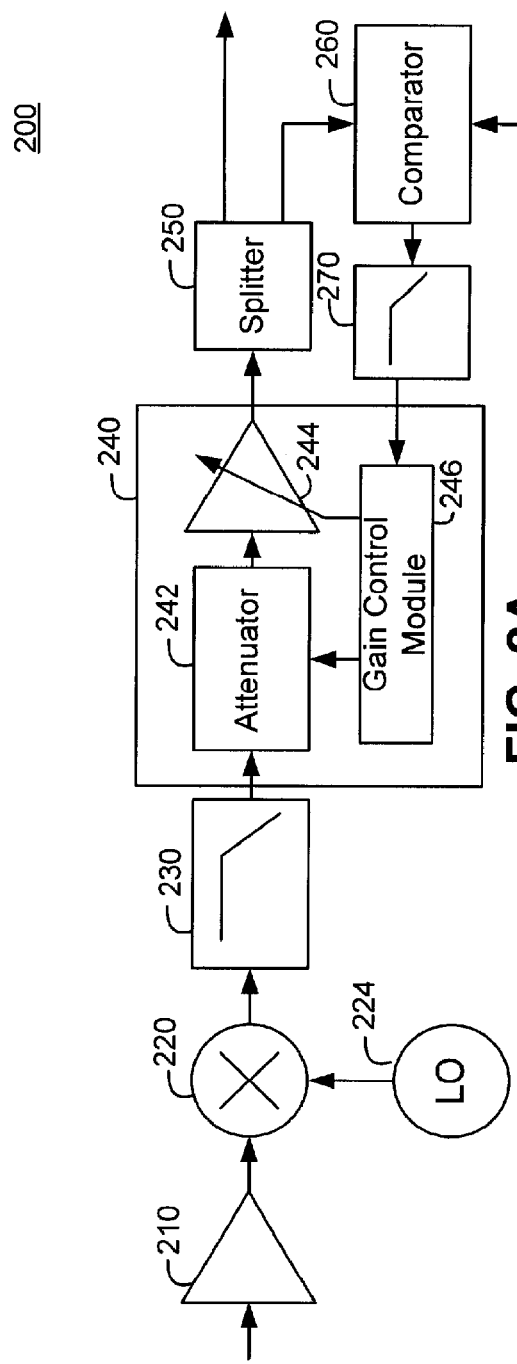
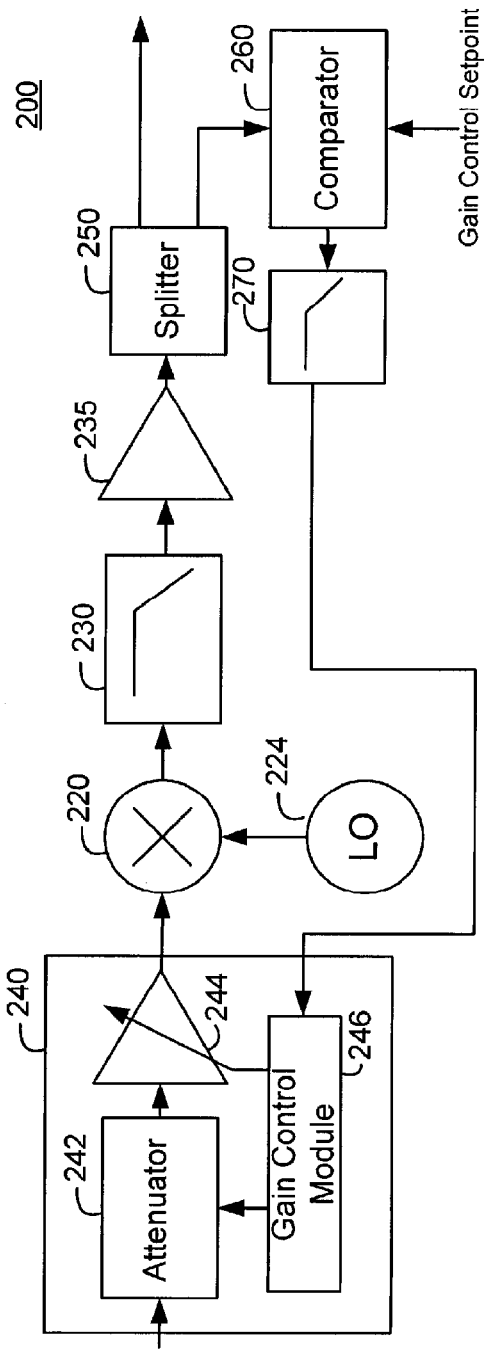
FIG. 2A
FIG. 2B

WIDE DYNAMIC RANGE AMPLIFIER GAIN CONTROL

CROSS-REFERENCES TO RELATED APPLICATIONS

This application claims the benefit of U.S. Provisional Application No. 60/707,867, filed Aug. 12, 2005, and entitled "GAIN CONTROL TECHNIQUE FOR LINEAR, WIDE DYNAMIC RANGE AMPLIFIERS," hereby incorporated by reference herein in its entirety.

BACKGROUND OF THE INVENTION

In telecommunication systems signals can be distributed to destination devices over a wide area using a variety of delivery mechanisms. For example, signals may be distributed to a receiver over a wireless communication link while other signals are distributed to the receiver over a wireline link. The receiver may be able to select which of the received signals to process. The receiver can be configured to select between the signals received over the wireless link or the signals received over the wireline link.

The received signal strength at the receiver can vary over a wide range due to the differing characteristics of the wireless link or wireline link. For example, signals received over a wireless link may be attenuated due to lack of proximity, occlusions, or destructive multiple path signal combinations. Similarly, a signal received over a wireline link may be attenuated due to propagation losses through the transmission line as well as losses due to splitting of the signal. However, a wireline signal distribution system can include one or more distribution amplifiers in branches of the wireline signal distribution system in order to maintain the power within a desired range at each of the distribution system endpoints.

It is desirable for a receiver having the ability to select from a signal received over a wireless link or a signal received over a wireline link to have the ability to compensate for the wide dynamic range of input signals presented by the union of the two operating systems.

A receiver typically includes one or more variable gain amplifiers within an automatic gain control loop in order to compensate for at least a portion of the variations in the received signal strength. Continuous gain control is desirable in a receiver because it allows for closed-loop control to maintain constant signal amplitude at the output of a receiver. A receiver typically includes one or more variable gain amplifiers within an automatic gain control loop in order to compensate for at least a portion of the variations in the received signal strength. One or more continuously-variable gain elements can be distributed throughout the receiver's signal path.

However, it is difficult to design a very linear amplifier capable of amplifying large input signals in a linear fashion which simultaneously possesses continuous gain control. A further complication is the desire to implement a relatively large dynamic range over which gain control operates.

BRIEF SUMMARY OF THE INVENTION

Linear wide dynamic range variable gain amplifiers can be configured using a variable gain amplifier having an abbreviated gain control range in combination with a discrete attenuator controlled to select an attenuation from a predetermined set of attenuation values. The variable gain amplifier is configured to provide substantially linear gain control over the abbreviated gain control range, where the abbreviated gain control range is less than a total desired gain control range. The difference between adjacent attenuation values in the set of attenuation values is configured to be approximately less than or equal to the abbreviated gain control range.

Aspects of the invention include an apparatus providing gain control over a desired dynamic range that includes an attenuator having a signal input, a signal output, and a control input and configured to attenuate a signal coupled to the control input by any one of a plurality of fixed attenuation values based on a control provided to the control input, a variable gain amplifier stage having a signal input, a signal output, and a stage gain control input, wherein the signal input is coupled to the signal output of the attenuator, and wherein the gain of the variable gain amplifier stage is continuously variable over a predetermined gain control range based on a gain control signal provided to the stage gain control input, and a gain control module having a gain control input, an attenuator control output coupled to the control input of the attenuator, and a stage gain control output coupled to the stage gain control input of the variable gain amplifier stage, wherein the gain control module is configured to receive a gain control signal at the gain control input, identify a gain control range from a plurality of partially overlapping gain control ranges based on the gain control signal, and control the attenuation provided by the attenuator and the gain of the variable gain amplifier stage based on the gain control signal and the gain control range that is identified.

Aspects of the invention include an apparatus providing gain control over a desired dynamic range that includes a step attenuator configured to selectively provide a plurality of fixed attenuation values in approximate increments of a fixed step, a variable gain stage in series with the step attenuator and including a variable gain amplifier having a continuous gain control range that is less than the desired dynamic range, and a gain control module configured to store a plurality of gain control ranges, where each gain control range partially overlaps with at least one other gain control range, and wherein each of the plurality of gain control ranges is defined by a particular attenuation value and the continuous gain control range, and wherein the gain control module is configured to receive a gain control signal and control an attenuation of the step attenuator and a gain of the variable gain stage based on an active gain control range and the gain control signal.

Aspects of the invention include a method of controlling gain over a desired dynamic range. The method includes receiving a gain control signal, determining a gain control region corresponding to the gain control signal from a plurality of partially overlapping gain control regions, determining an attenuation setting of an attenuator, determining whether the attenuation setting corresponds to an attenuation setting of the gain control region, and adjusting a gain of a variable gain stage based on the gain control region and the gain control signal.

Aspects of the invention include a method of controlling gain over a desired dynamic range. The method includes receiving a gain control signal, comparing the gain control signal to a plurality of thresholds, where each of a plurality of gain control ranges is defined by a pair of the plurality of thresholds and each of the plurality of gain control ranges corresponds to an attenuator setting of an attenuator, determining a change in an active gain control range, and adjusting a gain of a variable gain stage in series with the attenuator based on the active gain control range, wherein the variable gain stage has a continuous gain range that is smaller than the desired dynamic range.

Aspects of the invention include an apparatus providing gain control over a desired dynamic range that includes means for attenuating configured to selectively provide a plurality of fixed attenuation values in approximate increments of a fixed step, means for continuously varying gain in series with the means for attenuating and having a continuous gain control range that is less than the desired dynamic range, and means for controlling a gain configured to store a plurality of gain control ranges, where each gain control range partially overlaps with at least one other gain control range, and wherein each of the plurality of gain control ranges is defined by a particular attenuation value and the continuous gain control range, and wherein the means for controlling a gain is configured to receive a gain control signal and control an attenuation of the means for attenuating and a gain of the means for continuously varying gain based on an active gain control range and the gain control signal.

BRIEF DESCRIPTION OF THE DRAWINGS

The features, objects, and advantages of embodiments of the disclosure will become more apparent from the detailed description set forth below when taken in conjunction with the drawings, in which like elements bear like reference numerals.

FIGS. 2A-2B are simplified functional block diagrams of embodiments of a receiver implementing a wide dynamic range amplifier.

DETAILED DESCRIPTION OF THE INVENTION

Methods and apparatus are described for extending the signal range over which a variable gain amplifier or receiver can operate linearly while preserving continuous gain control. The methods and apparatus described herein allow a variable-gain amplifier to handle much larger signal levels than previously possible. The ability to provide linearity and continuous gain control over a wide dynamic range can be implemented using circuits which can be more easily integrated on a single integrated circuit than previously described solutions.

A wide dynamic range amplifier can include a variable gain stage in combination with an attenuator controllable over one of a plurality of discrete attenuation values, such as a step attenuator. The step attenuator is positioned in series with the variable gain stage and is advantageously positioned before the variable gain stage.

The variable gain stage is configured to provide substantially continuous gain control over a gain range that is less than the total desired dynamic range. The variable gain stage is configured such that the stage remains in substantially a linear operating region when outputting a signal at the maximum of the total desired dynamic range.

The attenuator is configured to provide any one of a plurality of discrete attenuation values. In one embodiment, the attenuator is configured to provide a plurality of attenuation values, where each attenuation value differs from the nearest attenuation value by approximately a predetermined fixed value The predetermined fixed value can be configured to be on the order of the gain range of the variable gain stage. For example, the attenuator can be configured to provide an attenuation value of n×dA dB of attenuation, where n is an integer multiplier value in [0:N] and dA is the predetermined fixed attenuation increment.

Thus, the series combination of the attenuator with the variable gain stage provides a gain that can be varied over the range of Gmin−N×dA through Gmax, where Gmin represents the minimum gain of the variable gain stage and Gmax represents the maximum gain of the variable gain stage.

Figure 1:
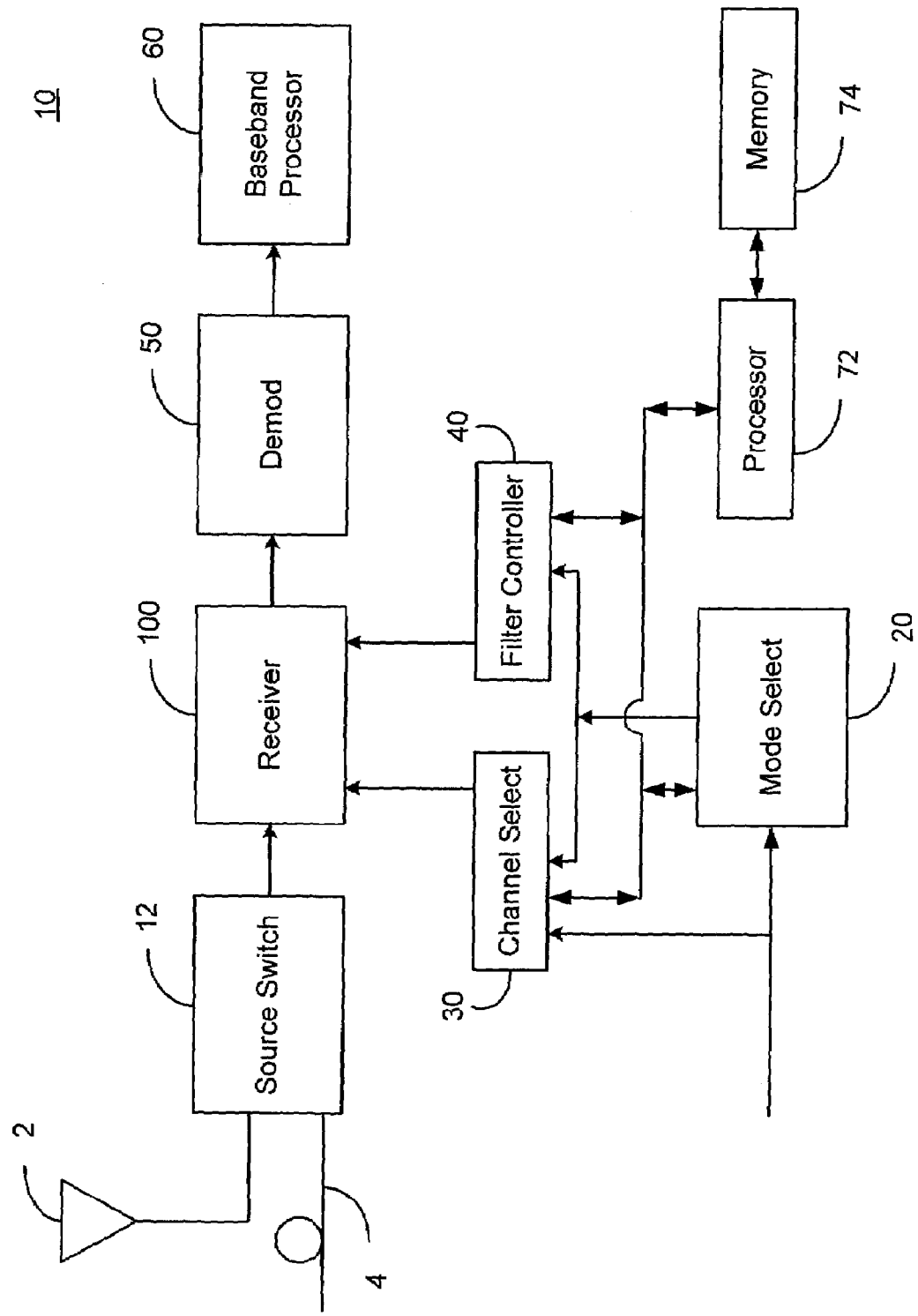
FIG. 1 is a simplified functional block diagram of an embodiment of a receiver implementing a wide dynamic range amplifier.

FIG. 1 is a simplified functional block diagram of an embodiment of a receiver 100 implementing a wide dynamic range variable gain amplifier in a system 10. The following description describes an embodiment in which the system 10 is configured to operate as a television receiver. However, the system 10 can be any of a plurality of systems. For example, the system 10 can be a television, television receiver, set top box, or television tuner integrated within a video recorder or some other television receiver. In other embodiments, the system 10 can be a radio receiver, wireless transceiver, telephone receiver, cellular telephone, cordless telephone, or some other communication device.

The system 10 can include a source switch 12 that can be coupled to one or more signal sources. For example, a first source input can be coupled to an antenna 2 and a second source input can be coupled to a wired source, such as a cable coupled to a cable television system. The source switch 12 is not limited to coupling only one type of signal to the receiver 100. For example, the source switch 12 can be coupled to a television signal source, for example, via the antenna 2, and can be coupled to a radio source, for example, via the cable 4.

The system 10 can receive signals that vary across a wireless signal dynamic range when the source switch 12 couples the signal from the antenna 2. Similarly, the system 10 can receive signals that vary across a cable system dynamic range when the source switch 12 couples the signals from the wired source via the cable 4. Typically, the wireless signal dynamic range is larger than the cable system dynamic range. Additionally, the wireless signal dynamic range may span a range of power levels that is lower than the lowest power within the cable system dynamic range. However, the receiver 100 is configured to process either the wireless or wired signal, and thus needs to have the ability to operate over the union of the wireless dynamic range and the cable dynamic range.

The source switch 12 can be configured to couple any one of the signals from any signal source to the input of the receiver 100. The receiver 100 can be, for example, configured to selectively process television signals received from a signal source, such as analog television signals formatted according to an analog television standard, such as NTSC, PAL, SECAM, or some other analog television standard. The receiver 100 can also be configured to process digital television signals, such as digital DVB-T television signals, received from one of the signal sources.

The receiver 100 can receive the RF signal from the source switch 12 and can downconvert the signal to an output IF. The output IF from the receiver 100 can be coupled to a demodulator 50 and from the demodulator 50 to a baseband processor 60. In one embodiment, the demodulator 50 can be configured to demodulate a television signal at a predetermined IF. The demodulated television signals are communicated to a baseband processor 60 that can be configured, for example, to format the signals into video and audio signals for corresponding video and audio output devices (not shown).

Alternatively, the receiver 100 can be configured to downconvert the received signal to a baseband signal, and the demodulator 50 can be configured to operate on the baseband signal. In such an embodiment, the demodulator 50 can be combined with the baseband processor 60.

The system 10 can also include a mode selection module 20 that can be configured to receive a mode selection input from an external source (not shown) that can be, for example, a user selection or user control. The mode can correspond to an operating mode of the receiver 100, and can be used to determine a particular operating band, channel spacing, channel bandwidths, and output IF frequency.

The mode select module 20 can be coupled to a channel select module 30. The channel select module 30 can be coupled to the mode select module 20 and can be configured to generate the desired local oscillator (LO) control signals. The channel select module 30 can generate the control signals needed to tune the LO frequencies of the receiver 100 to enable reception of the desired RF signal and generation of the desired output IF. The channel select module 30 can also receive one or more input signals from an external source (not shown), such as a user interface or some other module or device that can indicate a desired channel selection.

The channel select module 30 can independently control the RF and IF LOs within the receiver 100. For example, the channel select module 30 can tune the RF LO to a frequency that is based on both a mode and a desired channel. The channel select module 30 can also be configured to control the frequency of the IF LO and may be configured to control the IF LO based only on the desired mode. In other embodiments, the channel select module 30 can be configured to tune both the RF and LO frequencies for each channel.

A filter controller 40 can also be coupled to the mode select module 20. The filter controller 40 can be configured to provide the control signals to the receiver 100 that control one or more filter bandwidths within the receiver 100. The filter controller 40 can be configured to set the filter bandwidths based on the channel selectivity required in the receiver 100, which can depend on the operating mode.

The filter controller 40 can also be in communication with the channel select module 30. The filter controller 40 can be configured to control the filters within the receiver 100 to predetermined bandwidths for a predetermined calibration duration following each channel change. For example, the filter controller 40 can be configured to tune the filters to a minimal bandwidth during DC offset calibration. Alternatively, a calibration module within the receiver 100 can be configured to control the filter bandwidths during the calibration duration.

A processor 72 and associated memory 74 can be included within the system 10 and can be configured to perform one or more functions within each of the modules. For example, the memory 74 can include one or more processor 72 usable instructions in the form of software that can, when executed by the processor 72, perform some or all of the functions of the various modules within the system 10.

FIG. 2A is a simplified functional block diagram of an embodiment of a receiver 200 that can be implemented on one or more substrates of one or more integrated circuits (ICs). The receiver 200 can be, for example, an integrated circuit receiver configured to operate in a Radio Frequency (RF) communication system. For example, the receiver 200 can be an integrated circuit television tuner configured to operate from either cable television signals, locally generated signals, or over the air television sources. The receiver 200 can be, for example, the receiver in the system of FIG. 1.

In some embodiments, it may be advantageous to integrate the entire receiver on a single IC. In other embodiments, it may be advantageous to integrate a portion of the receiver 200 in a first IC or on a first substrate and integrate the remainder of the receiver 200 on a second IC or second substrate. The first and second substrates can be implemented in a single package or may be implemented in distinct packages. For example, a signal path within the receiver 200 can be implemented on a first substrate and one or more local oscillators can be implemented on a second substrate and couple to the first substrate through one or more interconnects.

Although the signal interconnections shown in FIG. 2 appear as single ended signal interconnects, it is generally understood that some or all of the interconnections can be implemented as differential connections. It may be advantageous to implement differential interconnections, for example, for the purposes of noise reduction.

Portions of the receiver 200 can be implemented digitally, and can be configured to operate on digital representations of the signal. The digital processing of the signals within the receiver 200, and embodiments of receivers 200 having digital portions, are not explicitly illustrated in the receiver 200 to allow the description to focus on the functionality of the various blocks and modules.

The receiver 200 includes an RF amplifier 210 coupled to receive the input signal and amplify the input signal, typically, by a fixed amount. As noted above, the input signal can be a received wireless signal or can be a signal coupled from a cable distribution system. The RF amplifier 210 can be a low noise amplifier (LNA) and is typically configured to operate in its linear region throughout the input dynamic range.

The amplified output from the RF amplifier 210 is coupled to a frequency converter, such as a mixer 220, configured to frequency translate the received RF signal to an Intermediate Frequency (IF) or baseband. A tunable Local Oscillator (LO) 224 is controlled to a frequency that frequency converts the desired RF signal to the IF or baseband output. For example, the input signal can be a composite RF signal having a plurality of channels over an operating frequency band and the LO 224 can be configured to downconvert the desired channel to the IF or baseband.

Although the frequency converter is depicted as a single mixer 220, the frequency conversion may occur over a plurality of frequency conversion stages, and is not limited to direct conversion in a single stage. Multiple LOs may be used in embodiments having multiple frequency conversion stages.

The output of the frequency converter is coupled to a filter 230 that is configured to pass the desired signal and substantially reject the adjacent channels as well as any other out of band interference sources. For example, where the desired RF signal is frequency converted to an IF, the filter 230 can be a bandpass filter having a bandwidth that is substantially the bandwidth of a signal channel. In the context of a television receiver, the filter 230 bandwidth can be substantially the bandwidth of a television channel, such as the bandwidth of an NTSC channel.

The output of the filter 230 is coupled to a wide dynamic range variable gain amplifier 240 that is implemented as part of an automatic gain control (AGC) loop. The AGC loop can be configured to control the gain of the wide dynamic range variable gain amplifier 240 such that the output signal power is substantially the same over the entire input dynamic range.

The wide dynamic range variable gain amplifier 240 includes a step attenuator 242 coupled to the input of the wide dynamic range variable gain amplifier 240 in series with a variable gain stage 244 having continuously variable gain control. A gain control module 246 accepts a gain control signal and controls the gain of the step attenuator 242 and variable gain stage 244 in response to the gain control signal. The operation of an embodiment of the wide dynamic range variable gain amplifier 240 is discussed in further detail below.

The output of the wide dynamic range variable gain amplifier 240 is coupled to a signal splitter 250. A first output of the signal splitter 250 is the output of the receiver 200. A second output of the signal splitter 250 is coupled to a comparator 260 that forms a portion of the feedback for the AGC loop.

The comparator 260 is configured to receive a version of the output signal and compare it against a predetermined gain control setpoint. The results of the comparison represent a raw feedback signal that is used to determine if the gain of the wide dynamic range variable gain amplifier 240 is to be increased or decreased.

The comparator 260 can include, for example, a power detector that is configured to translate the power of the receiver output signal to a representative voltage. The comparator 260 can compare the output voltage of the power detector against a gain control setpoint selected to achieve a desired output power. The comparator 260 can output a high voltage if the gain control setpoint is greater than the detected power level and can output a low voltage if the gain control setpoint is lower than the detected power level.

The output of the comparator 260 is coupled to a loop filter 270 that operates to filter the comparator 260 output. The bandwidth of the loop filter 270 determines the bandwidth of the AGC loop. Typically, the loop filter 270 is configured as a low pass filter having a relatively low pass band, such as on the order of Hertz or tens of Hertz. A low loop bandwidth is typically selected to underdamp the AGC loop and prevent the AGC loop from overshooting the desired gain level.

The output of the loop filter 270 is coupled to the gain control module 246 of the wide dynamic range variable gain amplifier 240. The AGC loop thus provides closed loop control of the wide dynamic range variable gain amplifier 240 gain, and thus, the receiver 200 output signal.

FIG. 2B is a simplified functional block diagram of an alternative embodiment of the receiver 200 with wide dynamic range variable gain amplifier. In the embodiment of FIG. 2B, the wide dynamic range variable gain amplifier 240 is configured as the front end amplifier and the fixed RF amplifier is omitted. In such an embodiment, a fixed gain IF amplifier 235 or baseband amplifier can be used after the frequency converter.

Figure 3:
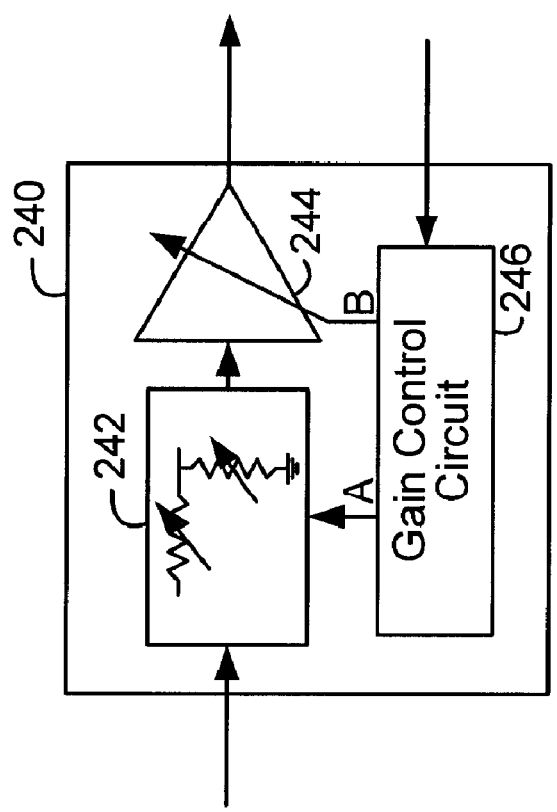
FIG. 3 is a simplified functional block diagram of an embodiment of a wide dynamic range variable gain amplifier.

FIG. 3 is a simplified functional block diagram of an embodiment of a wide dynamic range variable gain amplifier 240. The wide dynamic range variable gain amplifier 240 can be, for example, the wide dynamic range variable gain amplifier 240 of the receiver of FIG. 2.

The wide dynamic range variable gain amplifier 240 includes an attenuator 242, such as a passive step attenuator, in series with a variable gain stage 244. The gain range provided by the attenuator 242 combines with the continuous gain control range of the variable gain stage 244 in a coordinated fashion to provide an extended gain range The step attenuator 242 contributes to a very linear gain control circuit whose gain can be incremented or decremented in discrete steps. The attenuator's discrete steps are engaged to a selected attenuation value, and the continuous gain control of the variable gain stage 244 is increased or decreased in a synchronized fashion. When the attenuation provided by the attenuator 242 changes from one discrete value to another, the continuous gain control of the variable gain stage 244 is varied to compensate for the decrease or increase in the step attenuator's gain, respectively. This allows for a very linear gain control element to be applied at the front of the gain path to improve linearity and signal-handling capabilities, while preserving continuous gain control.

The linear, wide dynamic range variable gain amplifier 240 is useful where signals with very large dynamic ranges exist and where linear gain control is desired. It is particularly useful where it is desired to implement linear gain control on an integrated circuit. One example is in communication receivers such as a television tuner, which may receive weak signals from an antenna or very strong signals from a cable distribution network.

A Gain Control Module, here shown as a gain control circuit 246, controls the attenuation provided by the attenuator 242 and the variable gain provided by the variable gain stage 244. The entire wide dynamic range variable gain amplifier 240 apparatus can be implemented on a single integrated circuit (IC) substrate, and may be implemented as part of a receiver implemented on the IC.

The wide dynamic range variable gain amplifier 240 is depicted as a single-ended device for the purposes of clarity. One or more of the elements can be configured as differential circuits. For example, it may be advantageous to implement an RF signal path through the attenuator and variable gain amplifier as a differential circuit. In some embodiments, the control lines from the gain control circuit 246 to the attenuator 242 or variable gain stage 244 may be configured as differential signals.

The attenuator 242 is configured to provide discrete attenuation values, each of which can be selected by the gain control circuit 246. The attenuator 242 is configured to provide a range of attenuation values that, when combined with the gain range of the variable gain stage 244, substantially spans the desired total dynamic range. The entire dynamic range spanned by the attenuator 242 can be greater than, for example, 40 dB, 50 dB, 60 dB, 70 dB, 80 dB, 90 dB, or some other dynamic range.

The wide dynamic range variable gain amplifier 240 can be configured to span a dynamic range at the front end of a receiver that spans from approximately the noise floor to about 0 dBm or greater. For a noise bandwidth of approximately 1 GHz, the wide dynamic range variable gain amplifier 240 can be configured to operate with a front end that spans a dynamic range of greater than approximately 80 dB and about 84 dB.

In one embodiment, the attenuator 242 is configured as a step attenuator with a substantially fixed step size. The gain steps are typically implemented as log-linear steps of substantially equal size, although such an attenuator step configuration is not a limitation. The attenuator step size can be, for example, 2 dB, 3 dB, 5 dB, 7 dB, 10 dB, or some other attenuator step size.

The embodiment of the attenuator 242 is shown as a passive attenuator. The attenuator 242 is typically implemented using passive components, because the passive implementation can be extremely linear over a large power dynamic range as well as consistent over a large frequency range. However, when implemented in an integrated circuit, the attenuator elements can be implemented using passive devices, active devices, or a combination of passive and active devices. For example, resistors may be implemented as one or more resistors, diodes, or other passive devices. Additionally, one or more of the elements in the attenuator can include one or more active devices, including FETs, transconductance devices, transistors, and the like or some other variable impedance active devices. Some elements in the attenuator can include a combination of passive and active devices.

Although the attenuator 242 is depicted as an L-pad, such a configuration is provided as an example and, in general, any suitable attenuator configuration may be used. For example, in some embodiments, it may be advantageous to maintain a relatively constant input impedance, and the attenuator may be implemented using a constant impedance architecture. In other embodiments, the attenuator can be implemented as a pi-pad, a T-pad, bridged-T, and the like, or some other attenuator configuration or combination of configurations. The attenuator 242 can be capable of continuous gain control, but may be limited to discrete steps by operation of the gain control circuit 246. In an alternative embodiment, the attenuator can be a combination of a plurality of fixed attenuators in parallel, with a multiplexer selecting which of the fixed attenuators to couple to the signal path. In yet another embodiment, the attenuator 242 can be a series connection of a plurality of fixed attenuators, where each of the fixed attenuators can be selectively bypassed. Other attenuator 242 embodiments can use a combination of the embodiments described above.

The variable gain stage 244 can be a single variable gain amplifier, a plurality of variable gain amplifiers, or a combination of fixed and variable gain amplifiers. The variable gain stage 244 can be configured to provide substantially linear gain when controlled to its maximum gain value, with the attenuator 242 at its minimum attenuation, and the input signal at its maximum magnitude. However, in typical embodiments, the variable gain stage 244 does not provide maximum gain when the input signal is at a maximum value. Thus, the variable gain stage 244 can be selected to be linear over a range of expected input or output power.

It can be advantageous for the variable gain stage to have a substantially linear gain control response over a gain control range equal to, or exceeding, the largest discrete attenuation step provided by the attenuator 242. Thus, the gain control range of the variable gain stage 244 is a subset of the total desired dynamic range and is advantageously greater than the largest discrete step size selectable by the attenuator 242.

The gain control circuit 246 controls the discrete attenuation provided by the attenuator 242 and the gain provided by the variable gain stage 244 in a coordinated fashion to linearize the gain over the entire dynamic range.

The gain control circuit 246 receives a control signal to vary the gain of the wide dynamic range variable gain amplifier 240. The control signal is typically a control voltage that is generated by a comparator in an Automatic Gain Control loop, such as the one depicted in the receiver of FIG. 2.

The gain control circuit 246 can store control values corresponding to each of the discrete attenuation values provided by the attenuator 242. The gain control circuit 246 can store predetermined values in a memory, or the values can be determined by calibrating the attenuator 242 and storing the calibrated control values corresponding to the desired attenuation values.

For example, the gain of the variable gain stage 244 can be controlled to its maximum gain value. The input signal to the wide dynamic range variable gain amplifier 240 can be set to the maximum amplitude expected at the input of the amplifier. Alternatively, when the attenuator is calibrated within a receiver the input signal to the receiver can be set to the maximum expect ed receive signal power. Then, the gain control circuit 246 can vary the control signal applied to the attenuator 246. Those gain control values that result in substantially equal attenuator steps can be stored in a look-up table within the gain control circuit 246. The process can be repeated until the entire attenuator dynamic range is characterized.

Additionally, the gain control circuit 246 can store a calibration curve of the variable gain stage 244. The input signal to the wide dynamic range variable gain amplifier 240 can be set to a constant value, and the attenuator 242 can be controlled to provide a fixed attenuation value.

The gain control circuit 246 can set the gain control signal to the variable gain stage 244 to a minimum value and can increase the gain control signal and the change in the output signal can be monitored. The gain control circuit 246 can map the gain control signal to the gain of the variable gain stage 244. A linear portion of the gain curve can be selected and stored in a table within the gain control circuit. It is advantageous to select the most linear portion of the gain curve, and select a portion spanning a gain range larger than the largest discrete step provided by the attenuator 242. Alternatively, the endpoints of the gain control range can be stored in the look up table and a slope or rate of change of the gain curve can be stored in the look up table and the gain control circuit van compute the control signal value corresponding to a desired gain from the variable gain stage 244.

Thus, the gain control dynamic range over which the variable gain stage 244 spans can be limited to a fraction of the total dynamic range desired of the amplifier. The composite wide dynamic range variable gain amplifier 240 can provide a substantially linear gain control response over a dynamic range that far exceeds the gain control range of the variable gain stage 244

The gain control circuit 246 can map an input control voltage to a gain by mapping ranges of control voltage to each of the discrete attenuation values stored in the look up table and ranges of the control voltage to the control signal range of the variable gain stage 244. Thus, for each desired gain within the desired dynamic range from the wide dynamic range variable gain amplifier 240, there exists at least one combination of attenuator setting and variable gain stage setting.

The gain control circuit 244 can store one or more gain control threshold values that correspond to the ranges over which the attenuation provided by the attenuator is varied. Thus, for each discrete attenuator value, the gain control circuit can store a lower threshold and an upper threshold.

The gain control circuit 246 changes the discrete attenuation value each time the control voltage exceeds the bounds of the upper and lower thresholds.

The gain control circuit 246 can store discrete attenuation values and gain control ranges that are partially overlapping, in order to reduce the possibility of rapidly switching between discrete attenuation values. The amount of overlap in adjacent gain control ranges corresponds to a level of hysteresis. The operation of the gain control circuit 246 with hysteresis is described in combination with the characteristic curves shown in FIGS. 4A-4C.

Figure 4A:
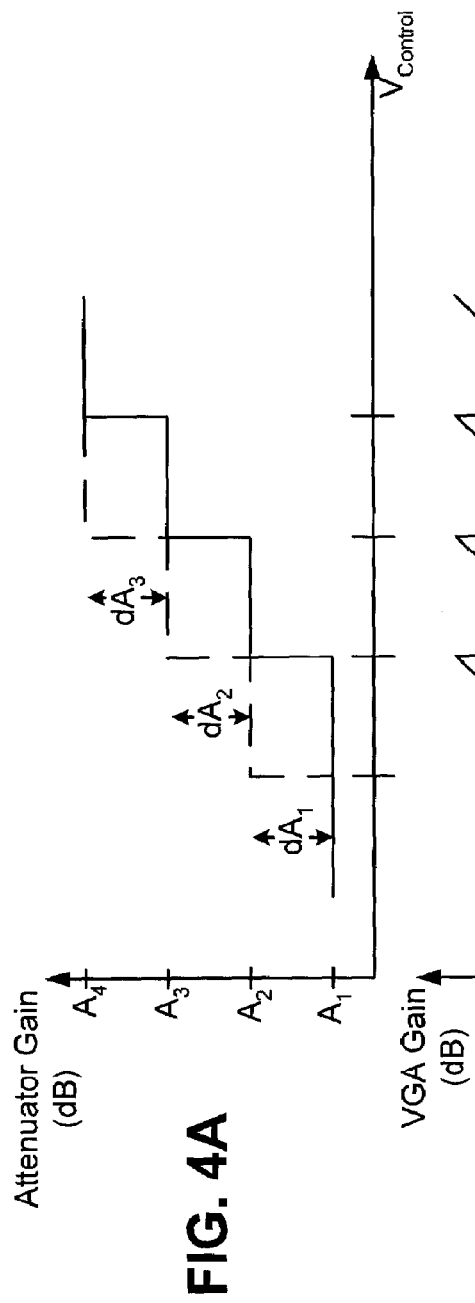
FIGS. 4A-4C are simplified diagrams of examples of an amplifier gain curve, variable gain control voltage, and discrete gain control voltage in an embodiment of a wide dynamic range variable gain amplifier.
Figure 4B:
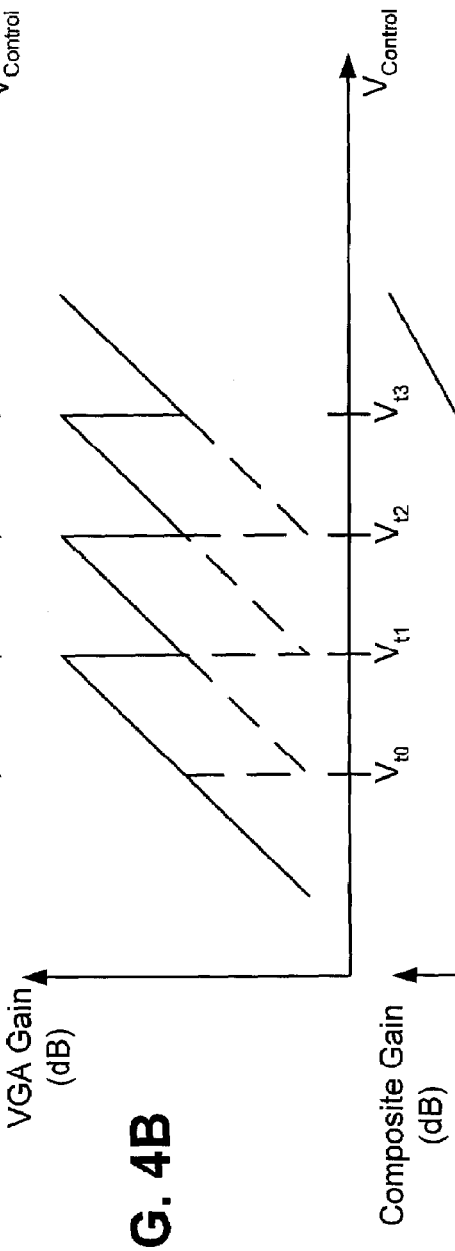
Figure 4C:
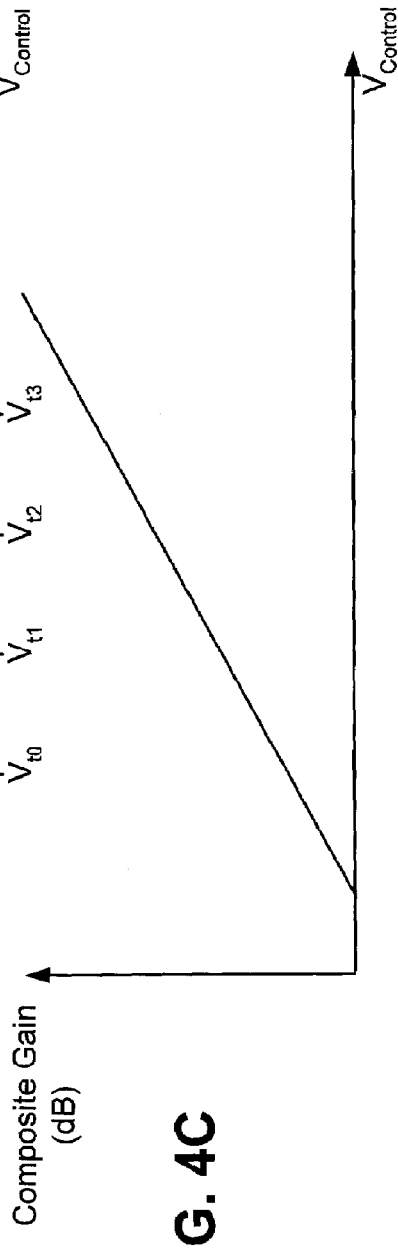

FIGS. 4A-4C are simplified diagrams of examples of an amplifier gain curve, variable gain control voltage, and discrete gain control voltage in an embodiment of a wide dynamic range variable gain amplifier. The wide dynamic range variable gain amplifier characterized by the curves can be, for example, the wide dynamic range variable gain amplifier of FIG. 3.

For the purposes of illustration, an attenuator with three gain steps $dA_{1-3}$ is shown. However the concept can clearly be extended to any number of gain steps. In one embodiment, the attenuator is configured to provide 3 steps of approximately 7 dB per step.

A control voltage $V_{control}$ is received by the gain control circuit, which is used to adjust the total gain of the system comprising an attenuator and a variable gain amplifier (VGA). The attenuator's gain can be changed in discrete steps $dA_{1-3}$, while the gain of the VGA is continuously variable over an amplifier gain control range that is less than the total desired dynamic range but greater than the attenuator step size.

The control voltage, $V_{control}$, can be generated, for example, using a detector operating as part of a gain control loop. The gain control loop can be set for a particular gain control setpoint, which can be predetermined or controllable within the receiver.

As $V_{control}$ is increased from its minimum value to maximum value, the gain control circuit independently adjusts the control signal to the attenuator and the VGA, signals A and B in FIG. 3 respectively, such that when voltage threshold $V_{t1}$ is crossed, the attenuator gain is increased by $dA_1$ (corresponding to a decrease in the level of attenuation) while the gain of VGA is decreased by the same amount. Similar control is applied when thresholds $V_{t2}$ and $V_{t3}$ are crossed. This is illustrated in FIGS. 4A and 4B by the solid traces. The resulting total gain of the system follows a smooth curve shown in FIG. 4C.

The gain control circuit implements a practice for eliminating oscillations known as "hysteresis," such that when $V_{control}$ is decreased, the attenuator and AGC gain curves follow the dashed lines in FIGS. 4A and 4B. That is, when $V_{control}$ falls below $V_{t2}$, the attenuator gain increases by $dA_3$ while the VGA's gain decreases by the same amount.

The embodiment illustrated in FIGS. 4A-4C use a plurality of overlapping gain ranges defined by the threshold voltages. Each gain range partially overlaps at least one other gain range. The level of overlap corresponds to the level of hysteresis. The hysteresis can thus be characterized in terms of a change in $V_{control}$ or in terms of a gain differential in the amplifier output.

For example, a first gain range is defined with the discrete attenuator set to $A_1$ and the gain of the VGA spanning the predetermined tuning range. The first gain range is bounded by zero volts at the low end and $V_{t1}$ at the upper end. A second gain control range is defined by a discrete attenuator set to $A_2$ and spans the range from $V_{t0}$ through $V_{t1}$. Similarly, a third gain control range is defined by a discrete attenuator set to $A_3$ and spans the range from $V_{t1}$ through $V_{t3}$. The hysteresis can be characterized by the difference in the threshold voltages, for example $V_{t1}$-$V_{t0}$. The same hysteresis can be characterized by the change in amplifier gain, for example in dB, at the two threshold points.

The three gain control ranges have partially overlapping regions, and the gain control circuit uses the overlapping gain control regions to implement gain control hysteresis. For example, the gain control region between thresholds $V_{t1}$ and $V_{t2}$ corresponds to two distinct gain control ranges. If the wide dynamic range variable gain amplifier is operating in the first gain control region, with the attenuator set to $A_1$, the wide dynamic range variable gain amplifier remains in the gain control region until the control voltage exceeds $V_{t1}$. When the control voltage exceeds the upper threshold, $V_{t1}$, the wide dynamic range variable gain amplifier transitions to the second gain control region bounded by thresholds $V_{t0}$ and $V_{t1}$. The wide dynamic range variable gain amplifier does not transition back to the first gain control region unless the control voltage is decreased below the lower threshold, $V_{t0}$.

The gain control circuit can be implemented by a priori storing the attenuation values, $A_{1-3}$, or the step size values $dA_{1-3}$ and their corresponding threshold voltages $V_{t0-3}$ through a calibration process, or the system can be designed to such that the values $dA_{1-3}$ are substantially identical, and the gain control curve for VGA is sufficiently well-controlled that no calibration is required.

Figure 5:
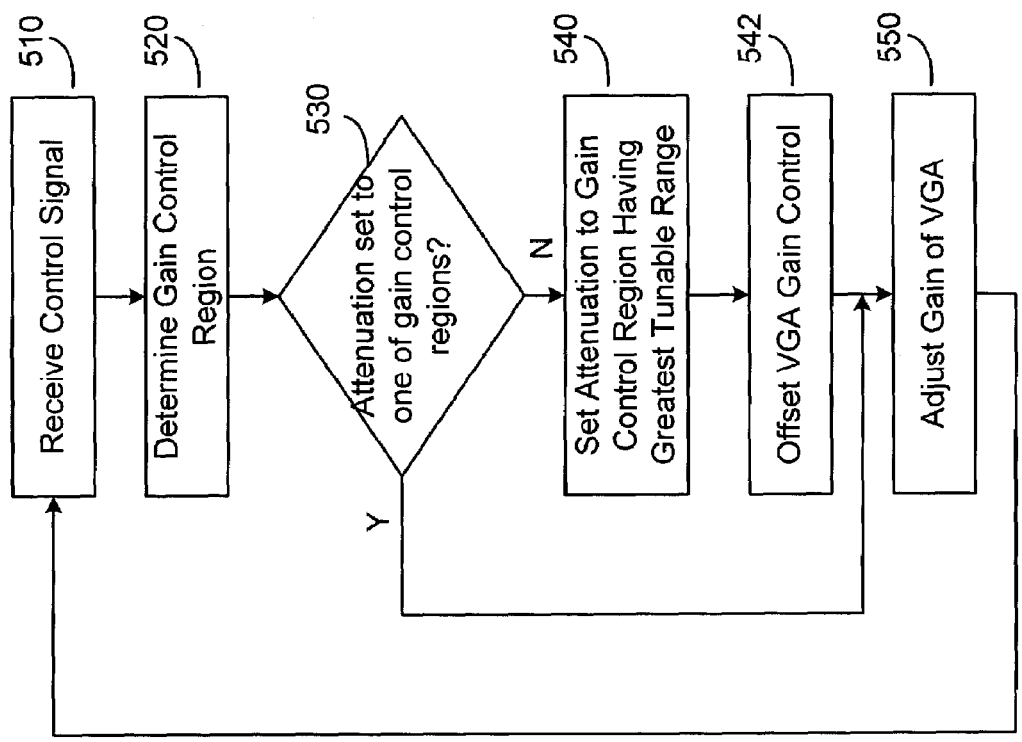
FIG. 5 is a simplified flowchart of an embodiment of a method of controlling a wide dynamic range variable gain amplifier.

FIG. 5 is a simplified flowchart of an embodiment of a method 500 of controlling the gain of a wide dynamic range variable gain amplifier. The method can be performed, for example, by a receiver implementing a wide dynamic range variable gain amplifier. For example, the receiver of FIG. 2 can perform the method 500 on the wide dynamic range variable gain amplifier of FIG. 3. In particular, the method 500 can be performed by the gain control module of the wide dynamic range variable gain amplifier.

The receiver can execute the method 500, for example, when the receiver initially powers up or after an even that can be expected to result in a substantial change in the received power, such as when switching a signal source from an antenna to a cable system.

The method 500 begins at block 510 where the receiver receives a gain control signal. As described above, the gain control signal can be generated within an AGC loop within the receiver that operates substantially continuously. The receiver can include a gain control module that is configured to receive the gain control signal. Typically, the gain control signal is a control voltage generated by a comparator that compares a metric generated from the amplified output signal with a predetermined gain control setpoint. The gain control setpoint is typically selected to maintain the amplified output signal at a desired operating point, such as a desired average power level.

Upon receiving the gain control signal, the receiver, and typically the gain control module of the wide dynamic range variable gain amplifier, determines which of the plurality of gain control regions encompasses the control signal. Because the plurality of gain control regions can partially overlap, there may be more than one gain control region that encompasses the gain control signal.

The gain control module proceeds to decision block 530 and determines whether the discrete attenuator is set to a value corresponding to one of the gain control regions. That is, the gain control module determines if the gain of the wide dynamic range variable gain amplifier is presently in an appropriate gain control region.

If so, the gain control module proceeds from decision block 530 to block 550 described below. If the gain control module determines at decision block 530 that the discrete attenuator is not set to a value corresponding to one of the gain control regions, the gain control module proceeds to block 540.

At block 540 the gain control module sets the value of the attenuator to the value associated with the gain control region having the widest operating range about the gain control signal. That is, where multiple gain control regions encompass the gain control signal, the gain control module selects the gain control region that allows the greatest gain control range without requiring another attenuator value change. The gain control module typically selects the gain control region having a midpoint closest to the gain control signal.

The gain control module proceeds from block 540 to block 542 where the gain control module within the receiver offsets the continuous gain control signal for the variable gain amplifier to compensate for the changed attenuation setting. For example, where the attenuator increases its attenuation value by a fixed value, the gain control module offsets the gain control voltage to the variable gain amplifier to adjust its gain upward by approximately the fixed value.

The gain control module proceeds to block 550 and further adjusts the gain of the variable gain amplifier. The gain control module can map the gain control signal to the VGA gain control value based on the predetermined gain control curve and the gain control region corresponding to the present attenuation value. After adjusting the gain of the variable gain amplifier, the gain control module can proceed back to block 510 for the next control signal update.

Figure 6:
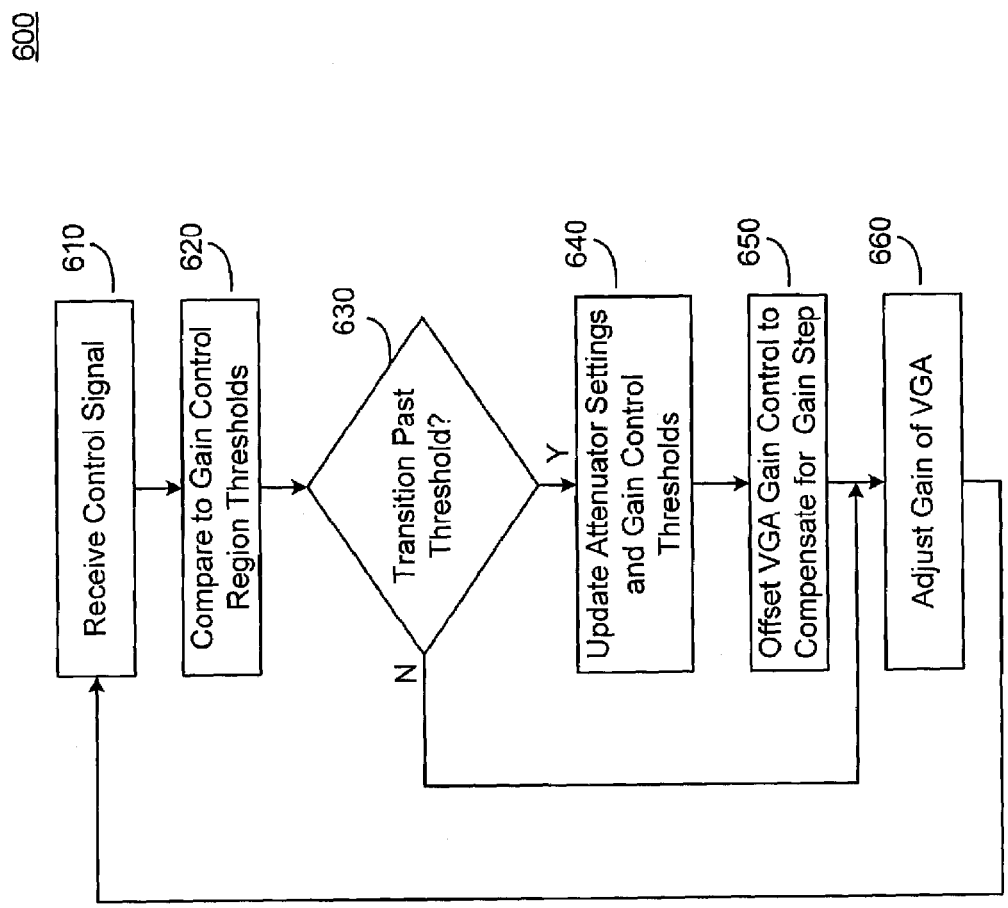
FIG. 6 is a simplified flowchart of a method of gain control in a receiver having a wide dynamic range variable gain amplifier.

FIG. 6 is a simplified flowchart of a method 600 of gain control in a receiver having a wide dynamic range variable gain amplifier. The method 600 can be performed, for example, by a receiver implementing a wide dynamic range variable gain amplifier. For example, the receiver of FIG. 2 can perform the method 600 on the wide dynamic range variable gain amplifier of FIG. 3.

The method 600 begins at block 610 where the gain control module receives a gain control signal. As described above, the gain control signal can be generated within an AGC loop within the receiver that operates substantially continuously.

The gain control module proceeds to block 620 and compares the gain control signal to the upper and lower thresholds of the active gain control region, where the active gain control region corresponds to the gain control region in which the gain control module is operating.

The gain control module proceeds to decision block 630 and determines if the gain control signal is outside of the gain control region defined by the upper and lower threshold values. A gain control signal outside of the boundaries defined by the upper and lower thresholds indicates a transition of the gain control signal past a threshold.

If, at decision block 630, the gain control module determines that the gain control signal did not transition past a threshold, the gain control module proceeds to block 660, described below. However, if the gain control module determines that the gain control signal transitioned past a threshold of the active gain control region, the gain control module proceeds from decision block 630 to block 640.

At block 640, the gain control module determines the updated gain control region and updates the attenuation provided by the attenuator to correspond to the updated gain control region. The gain control module can store an attenuator control signal in memory corresponding to each gain control region and can retrieve and apply the attenuator control signal corresponding to the updated gain control region. The gain control module also determines the updated upper and lower thresholds, for example, by retrieving them from memory.

The gain control module proceeds to block 650 and offsets the VGA gain control signal to compensate for the transition to the updated gain control region. For example, if the gain control signal transitions to a value that results in the attenuator decreasing its gain by a fixed value, the gain control module decreases offsets the present VGA control signal by an amount that results in the VGA providing a gain that is reduced by substantially the fixed value.

The gain control module proceeds to block 660 and adjusts the gain of the VGA based on the gain control signal and the updated gain control region. The gain control module then proceeds back to block 610 to process the updated gain control signal.

In this manner, the transition between gain regions is transparent and the wide dynamic range variable gain amplifier appears to operate as if it has a continuous gain control over the entire dynamic range. The combination of the discrete attenuator with the linear VGA provides a variable gain amplifier having a linear gain range that is larger than a gain range achievable using only variable gain stages.

Disclosed is a method of implementing a variable gain that includes positioning a discrete step attenuator in front of a variable gain amplifier. The discrete step attenuator can be configured to have substantially equally spaced attenuation steps and the variable gain amplifier can be configured to be have a gain control response that is substantially linear over the largest attenuation step size. A gain control module can receive an AGC signals and can control the discrete step attenuator and the variable gain attenuator in a manner that provides a substantially linear gain control response. The discrete step attenuator, variable gain amplifier, and gain control module can be implemented on a single semiconductor substrate or within a single integrated circuit.

The steps of a method, process, or algorithm described in connection with the embodiments disclosed herein may be embodied directly in hardware, in a software module executed by a processor, or in a combination of the two. The various steps or acts in a method or process may be performed in the order shown, or may be performed in another order. Additionally, one or more process or method steps may be omitted or one or more process or method steps may be added to the methods and processes. An additional step, block, or action may be added in the beginning, end, or intervening existing elements of the methods and processes.

The above description of the disclosed embodiments is provided to enable any person of ordinary skill in the art to make or use the disclosure. Various modifications to these embodiments will be readily apparent to those of ordinary skill in the art, and the generic principles defined herein may be applied to other embodiments without departing from the spirit or scope of the disclosure. Thus, the disclosure is not intended to be limited to the embodiments shown herein but is to be accorded the widest scope consistent with the principles and novel features disclosed herein.

What is claimed is:

1. An apparatus providing gain control over a desired dynamic range, the apparatus comprising:
   an attenuator having a signal input, a signal output, and a control input and configured to attenuate a signal coupled to the control input by any one of a plurality of fixed attenuation values based on a control provided to the control input;

a variable gain amplifier stage having a signal input, a signal output, and a stage gain control input, wherein the signal input is coupled to the signal output of the attenuator, and wherein the gain of the variable gain amplifier stage is continuously variable over a predetermined gain control range based on a gain control signal provided to the stage gain control input; and a gain control module having a gain control input, an attenuator control output coupled to the control input of the attenuator, and a stage gain control output coupled to the stage gain control input of the variable gain amplifier stage, wherein the gain control module is configured to receive a gain control signal at the gain control input, identify a gain control range from a plurality of partially overlapping gain control ranges based on the gain control signal, and control the attenuation provided by the attenuator and the gain of the variable gain amplifier stage based on the gain control signal and the gain control range that is identified.

2. The apparatus of claim 1, wherein the attenuator comprises a step attenuator and the plurality of fixed attenuation values differ by approximately an integer multiple of a step size.

3. The apparatus of claim 1, wherein the attenuator comprises a passive attenuator.

4. The apparatus of claim 1, wherein the predetermined gain control range of the variable gain amplifier stage is less than the desired dynamic range.

5. The apparatus of claim 1, wherein the predetermined gain control range of the variable gain amplifier stage is greater than a difference between any two adjacent attenuation values from the plurality of fixed attenuation values.

6. The apparatus of claim 1, wherein the sum of a range of attenuation values from the attenuator with the predetermined gain control range of the variable gain amplifier stage is greater than the desired dynamic range.

7. The apparatus of claim 1, wherein the variable gain amplifier stage is configured to operate in a linear region when the attenuator is controlled to a minimum attenuation value and a maximum expected signal is coupled to the signal input of the attenuator.

8. The apparatus of claim 1, wherein the gain control module is configured to store a plurality of threshold values, wherein each of the plurality of partially overlapping gain control ranges is defined by a distinct pair of threshold values.

9. The apparatus of claim 1, wherein the gain control module is configured to store an attenuator control setting for each of plurality of fixed attenuation values of the attenuator.

10. An apparatus providing gain control over a desired dynamic range, the apparatus comprising:
a step attenuator configured to selectively provide a plurality of fixed attenuation values in approximate increments of a fixed step;
a variable gain stage in series with the step attenuator and including a variable gain amplifier having a continuous gain control range that is less than the desired dynamic range; and
a gain control module configured to store a plurality of gain control ranges, where each gain control range partially overlaps with at least one other gain control range, and wherein each of the plurality of gain control ranges is defined by a particular attenuation value and the continuous gain control range, and wherein the gain control module is configured to receive a gain control signal and control an attenuation of the step attenuator and a gain of the variable gain stage based on an active gain control range and the gain control signal.

11. The apparatus of claim 10, wherein each partial overlap of again control ranges corresponds to a hysteresis level.

12. The apparatus of claim 10, wherein the gain control module is configured to offset a gain of the variable gain stage by approximately the fixed step when the gain control module varies the step attenuator by a single step.

13. A method of controlling gain over a desired dynamic range, the method comprising:
receiving a gain control signal;
determining a gain control region corresponding to the gain control signal from a plurality of partially overlapping gain control regions;
determining an attenuation setting of an attenuator;
determining whether the attenuation setting corresponds to an attenuation setting of the gain control region; and
adjusting a gain of a variable gain stage based on the gain control region and the gain control signal.

14. The method of claim 13, further comprising:
updating the attenuation value to an attenuation setting corresponding to the gain control region; and
offsetting a gain of the variable gain stage based on the updated attenuation value.

15. The method of claim 13, further comprising:
incrementing the attenuation value of a step attenuator to a next attenuation step based on the gain control region; and
increasing a gain of the variable gain stage by approximately a step size of the step attenuator.

16. The method of claim 13, wherein receiving the gain control signal comprises receiving a gain control voltage from an automatic gain control loop.

17. The method of claim 13, wherein determining the gain control region comprises comparing the gain control signal to a plurality of thresholds defining each of the plurality of partially overlapping gain control regions.

18. The method of claim 13, wherein each of the plurality of partially overlapping gain control regions partially overlaps at least one other gain control region.

19. A method of controlling gain over a desired dynamic range, the method comprising:
receiving a gain control signal;
comparing the gain control signal to a plurality of thresholds, where each of a plurality of gain control ranges is defined by a pair of the plurality of thresholds and each of the plurality of gain control ranges corresponds to an attenuator setting of an attenuator;
determining a change in an active gain control range; and
adjusting a gain of a variable gain stage in series with the attenuator based on the active gain control range, wherein the variable gain stage has a continuous gain range that is smaller than the desired dynamic range.

20. The method of claim 19, further comprising:
updating an attenuator setting based on the change of the active gain control range; and
offsetting a gain of the variable gain stage by approximately a change in the attenuator setting.

21. The method of claim 19, wherein an upper threshold of a first gain control range is greater than a lower threshold of a second gain control range.

22. The method of claim 19, wherein the continuous gain range of the variable gain stage is greater than an attenuator step size.

23. An apparatus providing gain control over a desired dynamic range, the apparatus comprising:

means for attenuating configured to selectively provide a plurality of fixed attenuation values in approximate increments of a fixed step;

means for continuously varying gain in series with the means for attenuating and having a continuous gain control range that is less than the desired dynamic range; and means for controlling a gain configured to store a plurality of gain control ranges, where each gain control range partially overlaps with at least one other gain control range, and wherein each of the plurality of gain control ranges is defined by a particular attenuation value and the continuous gain control range, and wherein the means for controlling a gain is configured to receive a gain control signal and control an attenuation of the means for attenuating and a gain of the means for continuously varying gain based on an active gain control range and the gain control signal.

* * * * *